(12) United States Patent
Nakamura et al.

(10) Patent No.: US 10,139,447 B2
(45) Date of Patent: Nov. 27, 2018

(54) IMAGE GENERATION APPARATUS AND IMAGE GENERATION METHOD

(71) Applicant: HAMAMATSU PHOTONICS K.K., Hamamatsu-shi, Shizuoka (JP)

(72) Inventors: Tomonori Nakamura, Hamamatsu (JP); Mitsunori Nishizawa, Hamamatsu (JP)

(73) Assignee: HAMAMATSU PHOTONICS K.K., Hamamatsu-shi, Shizuoka (JP)

( * ) Notice: Subject to any disclaimer, the term of this patent is extended or adjusted under 35 U.S.C. 154(b) by 234 days.

(21) Appl. No.: 14/692,019

(22) Filed: Apr. 21, 2015

(65) Prior Publication Data
US 2015/0309115 A1  Oct. 29, 2015

(30) Foreign Application Priority Data

Apr. 24, 2014  (JP) ................................. 2014-089918

(51) Int. Cl.
  *G01R 31/311* (2006.01)
  *G01R 31/308* (2006.01)
(52) U.S. Cl.
  CPC .......... *G01R 31/311* (2013.01); *G01R 31/308* (2013.01)
(58) Field of Classification Search
  CPC .... G01R 31/308; G01R 31/311; G01R 19/00; H04B 10/6911
  USPC .................................................. 324/754.23
  See application file for complete search history.

(56) References Cited

U.S. PATENT DOCUMENTS

| | | | | |
|---|---|---|---|---|
| 5,952,837 A | * | 9/1999 | Koyama | G01R 31/311 324/754.23 |
| 6,222,660 B1 | * | 4/2001 | Traa | H04B 10/077 398/154 |
| 7,659,981 B2 | | 2/2010 | Lo et al. | |
| 7,733,100 B2 | | 6/2010 | Kasapi | |
| 8,686,748 B2 | | 4/2014 | Kasapi | |
| 8,754,633 B2 | | 6/2014 | Ng et al. | |
| 2006/0050460 A1 | * | 3/2006 | Ebata | G06F 1/30 361/84 |
| 2007/0002328 A1 | | 1/2007 | Woods et al. | |
| 2007/0046301 A1 | * | 3/2007 | Kasapi | G01R 31/308 324/754.22 |
| 2007/0046947 A1 | * | 3/2007 | Lo | G01R 31/307 356/492 |

(Continued)

FOREIGN PATENT DOCUMENTS

| | | |
|---|---|---|
| JP | H10-111347 | 4/1998 |
| JP | 2005-114678 | 4/2005 |

(Continued)

*Primary Examiner* — Melissa Koval
*Assistant Examiner* — Courtney McDonnough
(74) *Attorney, Agent, or Firm* — Drinker Biddle & Reath LLP (57) ABSTRACT

An image generation apparatus is an image generation apparatus that generates an image based on measurement light from the semiconductor device, and the image generation apparatus includes an optical sensor that detects the measurement light, an optical sensor power supply that applies a constant voltage to the optical sensor to supply a current to the optical sensor, a current detector that generates a pattern signal according to magnitude of the current supplied to the optical sensor by the optical sensor power supply, and a control device that generates a pattern image based on the pattern signal.

12 Claims, 6 Drawing Sheets

(56) References Cited

U.S. PATENT DOCUMENTS

2011/0304311 A1* 12/2011 Takahashi ........... H01L 27/1225
323/311

FOREIGN PATENT DOCUMENTS

| JP | 2006-129353 | 5/2006 |
| JP | 2007-064975 A | 3/2007 |
| JP | 2009-300202 | 12/2009 |
| TW | 318209 | 10/1997 |
| WO | WO 2013/020698 | 2/2013 |

* cited by examiner

IMAGE GENERATION APPARATUS AND IMAGE GENERATION METHOD

BACKGROUND OF THE INVENTION

Field of the Invention

The present invention relates to an image generation apparatus and an image generation method.

Related Background Art

An optical probing technology called EOP (Electro Optical Probing) or EOFM (Electro-Optical Frequency Mapping) is known as a technology for testing a measurement target such as an integrated circuit (for example, see Patent Document 1). In the optical probing technology, the integrated circuit is irradiated with light emitted from a light source, measurement light (reflected light) from the integrated circuit is detected by an optical sensor, and a detection signal is acquired. Also, in the acquired detection signal, a desired frequency is selected, and amplitude energy of the signal is displayed over time. Or, image display is performed through two-dimensional mapping. Accordingly, it is possible to specify a position of a circuit operating at a desired frequency.

Patent Document 1: Japanese Patent Laid-Open Publication No. 2007-064975

The optical probing technology described above can specify a failure place and a failure cause in a semiconductor device such as an integrated circuit. Here, in image display in the methods of Patent Document 1 described above, when an acquired detection signal of a photodetector is branched according to a desired frequency band to acquire a video image (pattern image) and a modulation image (EOFM image), an S/N ratio of their images may not be sufficiently high. Therefore, an object of the present invention is to provide an image generation apparatus and an image generation method in which improvement of an S/N ratio of an image is achieved.

SUMMARY OF THE INVENTION

An image generation apparatus according to an aspect of the present invention is an apparatus that generates an image based on light from the object, the image generation apparatus including: a photodetector that detects the light; a power supply unit that electrically couples the photodetector and applies a first constant voltage to the photodetector to supply a current to the photodetector; a signal generation unit that electrically couples the power supply unit and generates a first signal according to magnitude of the current supplied to the photodetector by the power supply unit; and an image processor that electrically couples the signal generation unit and generates a first image based on the first signal.

In this image generation apparatus, the constant voltage is applied and the current is supplied from the power supply unit to the photodetector. Thus, the current supplied from the power supply unit to the photodetector depends on the intensity of the light of the object. Also, since the first signal is generated based on the current and the first image is generated based on the first signal, the first image may depend on the intensity of the light of the object. Thus, since the image (the first image) according to the light of the object may be acquired without depending on the signal (detection signal) detected by the photodetector, for example, when two images according to the light of the object are desired to be acquired, one image can be acquired as the first image described above, and the other image can be acquired from the detection signal of the photodetector. For example, when the detection signal of the photodetector is branched according to a frequency band to acquire two images, an S/N ratio of the image may be degraded. In this regard, it is not necessary to branch the detection signal and it is possible to improve the S/N ratio of the image by acquiring the one image without depending on the detection signal of the photodetector, as in the image generation apparatus according to the present invention.

In the image generation apparatus according to the aspect of the present invention, the power supply unit may include a power supply that supplies a second voltage different from the first constant voltage; and a transformer that transforms the second voltage supplied from the power supply to the first constant voltage. By the predetermined voltage being transformed to the constant voltage in the power supply unit, it is possible to reliably generate the first signal and the first image according to the magnitude of the current supplied to the photodetector.

In the image generation apparatus according to the aspect of the present invention, the signal generation unit may measure the current flowing from the transformer to the photodetector to generate the first signal. Accordingly, it is possible to reliably measure the current supplied to the photodetector.

In the image generation apparatus according to the aspect of the present invention, the signal generation unit may include a first current detector that measures a current flowing through a wiring coupling the power supply to the transformer, and a second current detector that measures a current flowing through a wiring coupling the transformer to a ground potential line, and may measure a current supplied from the power supply to the photodetector to generate the first signal based on a difference between the current measured by the first current detector and the current measured by the second current detector. Since the difference between the current measured by the first current detector and the current measured by the second current detector and the current supplied from the power supply unit (more specifically, transformer) to the photodetector have a predetermined corresponding relationship, it is possible to reliably measure the current supplied from the power supply to the photodetector based on the above-described current difference.

In the image generation apparatus according to the aspect of the present invention, the transformer may be a DC/DC converter. Accordingly, it is possible to reliably perform transformation to a constant voltage.

In the image generation apparatus according to the aspect of the present invention, the object may be a semiconductor device. When the object is a semiconductor device, it is possible to effectively realize improvement of an S/N ratio of the image.

In the image generation apparatus according to the aspect of the present invention, a measurement unit that electrically couples the photodetector and measures at least one of a value indicating an in-phase component and a quadrature phase component, an amplitude, and a phase of a second signal output by the photodetector at a predetermined frequency or in a predetermined frequency band based on the second signal may be further included. Accordingly, it is possible to measure a parameter related to image generation from the second signal (detection signal) output by the photodetector.

In the image generation apparatus according to the aspect of the present invention, the image processor that generates a second image based on at least one of the value indicating an in-phase component and a quadrature phase component, the amplitude, and the phase of the second signal at the predetermined frequency or in the predetermined frequency band measured by the measurement unit may be further included. Accordingly, it is possible to generate a second image (for example, EOFM image) from the second signal. Therefore, it is possible to acquire the first image from the first signal and acquire the second image from the second signal.

In the image generation apparatus according to the aspect of the present invention, a display unit that displays a superimposed image that is superimposed the first image and the second image may be further included. Accordingly, for example, it is possible to acquire a superimposed image in which the first image is a pattern image and the second image is an EOFM image.

An image generation method according to an aspect of the present invention is an image generation method in which an image is generated based on light from the object, the image generation method including: applying a first constant voltage to a photodetector that detects the light, to supply a current to the photodetector; generating a first signal according to magnitude of the current supplied to the photodetector; and generating a first image based on the first signal.

In the image generation method according to the aspect of the present invention, the applying of the first constant voltage to supply the current may include supplying, by a power supply, a second voltage different from the first constant voltage; and transforming, by a transformer, the second voltage supplied from the power supply to the first constant voltage.

In the image generation method according to the aspect of the present invention, the generating of the first signal may include measuring the current flowing from the transformer to the photodetector to generate the first signal.

In the image generation method according to the aspect of the present invention, the generating of the first signal may include measuring, by a first current detector, a current flowing through a wiring coupling the power supply to the transformer; measuring, by a second current detector, a current flowing through a wiring coupling the transformer to a ground potential line, and measuring a current supplied from the power supply to the photodetector to generate the first signal based on a difference between the current measured by the first current detector and the current measured by the second current detector.

DESCRIPTION OF THE PREFERRED EMBODIMENTS

Preferred embodiments of the present invention will be described in detail with reference to the drawings. Further, the same portions or corresponding portions in the respective drawings are denoted with the reference numerals and repeated description will be omitted.

First Embodiment

Figure 1:
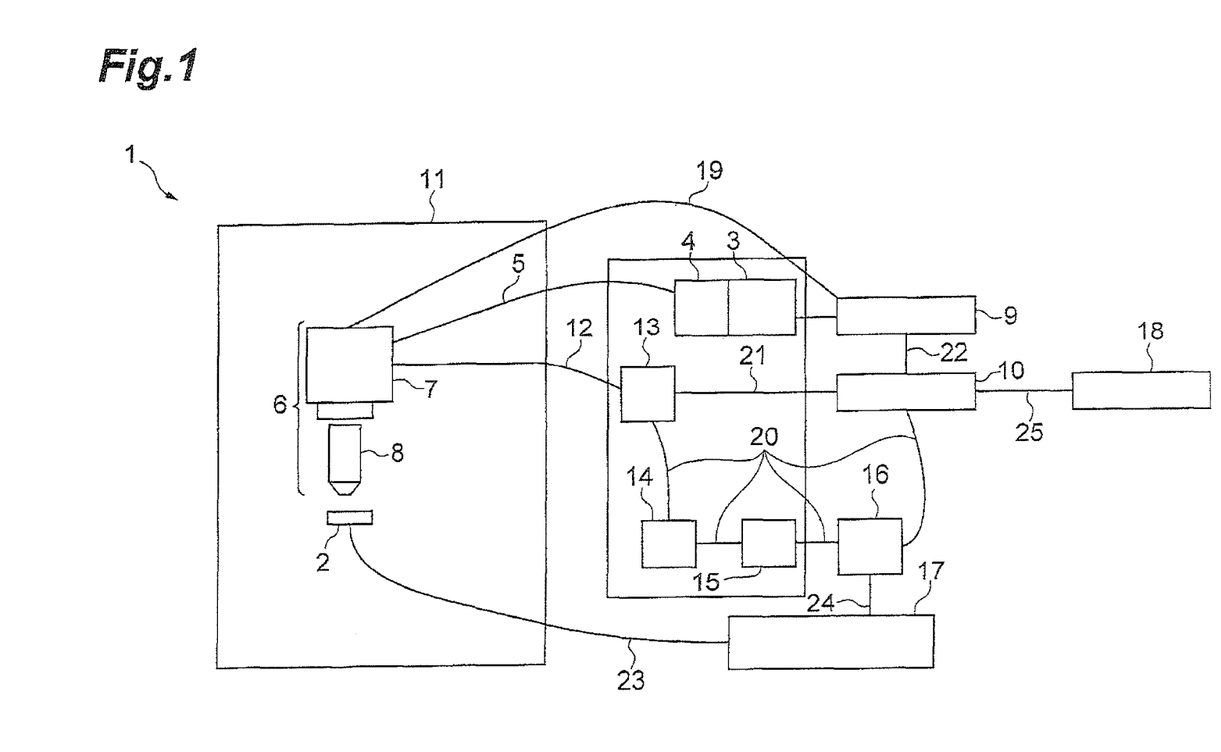
FIG. 1 is a configuration diagram of an image generation apparatus of a first embodiment of the present invention.

An image generation apparatus 1 according a first embodiment is an apparatus for testing a semiconductor device 2 that is a measurement target and is a device under test (DUT), for example, specifying an abnormality occurrence place in the semiconductor device 2, as illustrated in FIG. 1. The semiconductor device 2 includes an integrated circuit having a PN junction such as a transistor, for example, a small scale integration (SSI), a medium scale integration (MSI), a large scale integration (LSI), a very large scale integration (VLSI), an ultra large scale integration (VLSI), or a giga scale integration (GSI)), a MOS transistor and a bipolar transistor for high current/high voltage, or the like.

A tester unit 17 is electrically coupled to the semiconductor device 2 via a device control cable 23. The tester unit 17 is operated by a power supply (not illustrated) and repeatedly applies a predetermined test signal (test pattern) to the semiconductor device 2. Elements such as transistors formed in the semiconductor device 2 are driven by the test signal. Since various transistors are formed in the semiconductor device 2, there is a plurality of driving frequencies according to a combination of ON/OFF of the respective transistors. Therefore, there is a plurality of modulation frequencies of measurement light (reflected light) from the semiconductor device 2. The tester unit 17 may include a pulse generator. The tester unit 17 is electrically coupled to a spectrum analyzer 16 to be described below via a timing signal cable 24.

The image generation apparatus 1 includes a laser light source 3. The laser light source 3 is operated by a power supply (not illustrated) to generate and emit light with which the semiconductor device 2 is irradiated. The laser light source 3 is, for example, a lamp-based laser light source or a laser diode that generates laser light that is coherent light. The light emitted from the laser light source 3 is guided to a scan optical system 6 via a polarization preserving single-mode optical coupler 4 and a polarization preserving single-mode optical fiber 5 for probe light.

The scan optical system 6 includes a scan head 7 and a lens system 8 (for example, an objective lens) and is configured of, for example, a light scanning element such as a galvanometer mirror. The light guided to the scan head 7 is focused on the semiconductor device 2 by the lens system 8. Accordingly, the light guided to the scan optical system 6 is imaged in a predetermined irradiation position of the semiconductor device 2. The irradiation position of the light is two-dimensionally scanned with respect to the semiconductor device 2 by the scan optical system 6. The irradiation position scanned by the scan optical system 6 is controlled by a laser scan controller 9. The laser scan controller 9 is electrically coupled to the scan head 7 of the scan optical system 6 via the laser scan controller control cable 19 and to the laser light source 3. The laser scan controller 9 designates, for example, the irradiation position with respect to the scan optical system 6 based on two-dimensional positional information indicated by a position (an x position and a y position) on orthogonal x and y axes. The laser scan controller 9 inputs the irradiation position indicated by the x position and the y position to a control unit 10 electrically coupled via a control cable 22. Further, the respective components (scan head 7 and lens system 8) of the scan optical system 6, and the semiconductor device 2 are arranged in a dark box 11.

Figure 2:
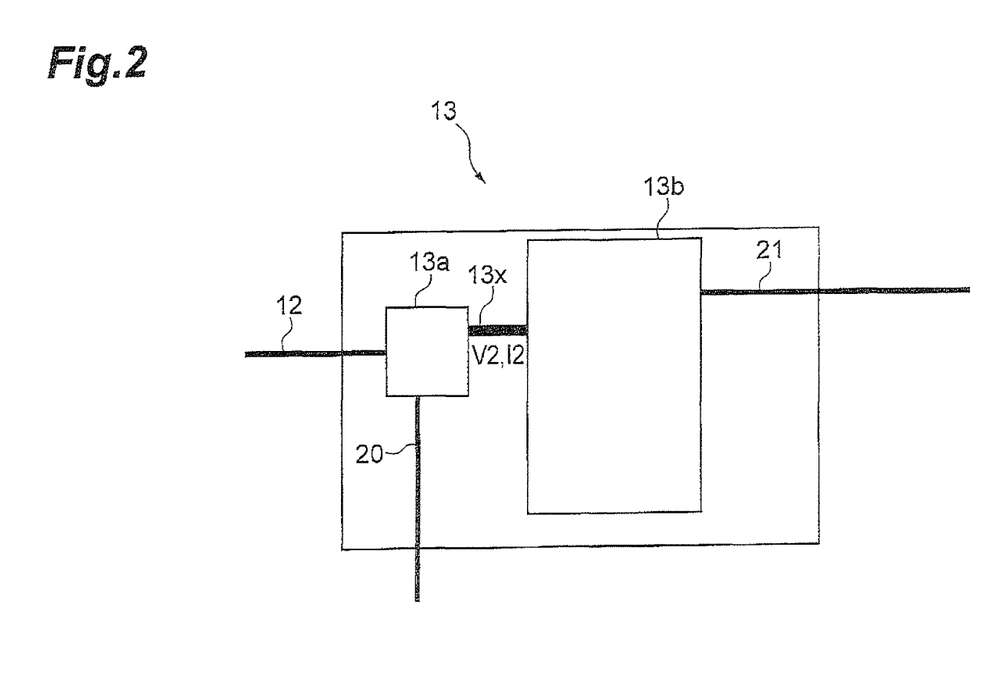
FIG. 2 is a configuration diagram of an optical sensor unit in the image generation apparatus of FIG. 1.

Measurement light reflected by the semiconductor device 2 when the semiconductor device 2 is irradiated with the light emitted from the laser light source 3 is returned to the scan head 7 by the lens system 8 and guided to an optical sensor unit 13 via an optical fiber 12 for return light. The optical sensor unit 13 includes an optical sensor (photodetector) 13a that detects the measurement light and outputs a detection signal (a second signal), and an optical sensor power supply (power supply unit) 13b that applies a constant voltage V2 (a first constant voltage) to the optical sensor 13a to supply a current I2, as illustrated in FIG. 2. The optical sensor 13a and the optical sensor power supply 13b are electrically coupled via an optical sensor power supply line 13x. The optical sensor 13a includes, for example, a photodiode, an avalanche photodiode, a photomultiplier tube, an area image sensor, or the like.

Figure 3:
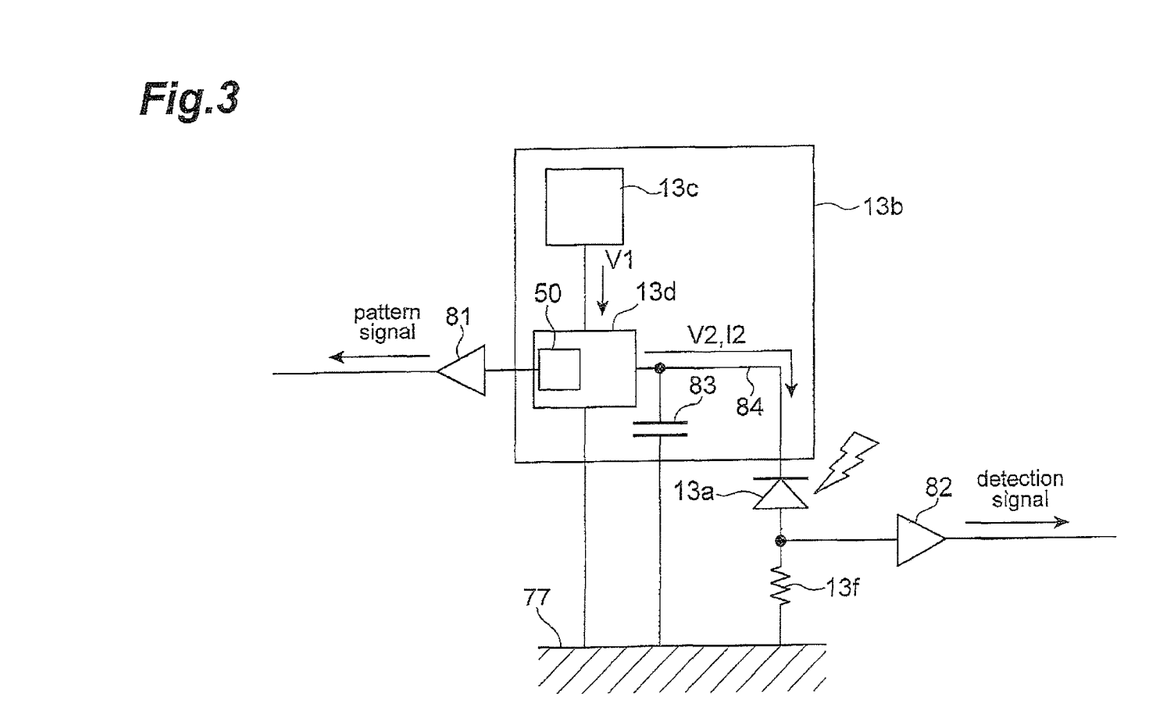
FIG. 3 is a diagram illustrating a current detector in the optical sensor unit of FIG. 2.

The optical sensor power supply 13b includes a board power supply 13c (power supply) that supplies a predetermined voltage (power), and a DC/DC converter 13d (a transformation unit, a transformer) that receives the voltage supplied from the board power supply 13c, as illustrated in FIG. 3. The board power supply 13c supplies a predetermined voltage V1 (a second voltage) to the DC/DC converter 13d. For example, a switching regulator which is a voltage converter using a switching element, or a linear regulator which is a voltage comparator using a voltage current control element such as a transistor can be used as the DC/DC converter 13d. The DC/DC converter 13d converts the voltage V1 supplied from the board power supply 13c to a constant voltage V2 for the optical sensor 13a, and applies the voltage V2 to the optical sensor 13a to supply the current I2 to the optical sensor 13a. Here, a driving state of the optical sensor 13a is changed according to intensity of measurement light reflected by the semiconductor device 2. Since the constant voltage V2 is applied from the optical sensor power supply 13b to the optical sensor 13a, the current I2 input to the optical sensor 13a is changed according to the driving state of the optical sensor 13a.

The DC/DC converter 13d includes, therein, a current detector (signal generation unit) 50 that measures the current I2 supplied from the optical sensor power supply 13b to the optical sensor 13a. The current detector 50 electrically couples the optical sensor power supply 13b. The current detector 50 measures the current I2 supplied from the DC/DC converter 13d to the optical sensor 13a after the transformation in the DC/DC converter 13d. The current detector 50 generates a signal (a first signal) according to magnitude of the measured current I2. The signal is a signal used for generation of a pattern image in the control unit 10 (which may be hereinafter described as a pattern signal). Therefore, the current detector 50 converts magnitude of the measured current I2 into the pattern signal. The pattern signal is, for example, a signal of a DC component or in a low frequency band. The pattern image is an image indicating a circuit pattern of the semiconductor device 2 and is an image indicating a scanning area in the scan optical system 6 (a scanning area image). Since a frequency of a change in the current is low, the pattern signal generated by the current detector 50 can be considered as being generated in a state in which a low pass filter is applied to the detection signal output from the optical sensor 13a. The pattern signal generated by the current detector 50 is amplified by an amplifier 81 and output to the control unit 10 via a pattern signal line 21. The current detector 50 includes a resistor, a Hall element, a current mirror circuit, a current transformer, or the like. Further, a wiring 84 via which the current I2 is supplied from the DC/DC converter 13d to the optical sensor 13a is coupled to a ground potential line 77 via a capacitor 83.

Referring back to FIG. 1, the detection signal output from the optical sensor unit 13 (more specifically, the optical sensor 13a) is input to the spectrum analyzer 16 via an amplifier 14 and an AC (alternating current) amplifier 15. The detection signal is used, for example, to generate an EOFM (electro optical frequency mapping) image, and is measured at a high frequency such as 10 kHz to 20 GHz. Further, the detection signal may be measured, for example, at a low frequency such as 10 KHz or lower. Further, the detection signal output from the optical sensor unit 13 is voltage-converted by a resistor 13f arranged at a subsequent stage of the optical sensor 13a, amplified by an amplifier 82, and output (see FIG. 3).

The spectrum analyzer (measurement unit) 16 measures amplitude and a phase of the detection signal at a predetermined frequency or a predetermined frequency band based on the detection signal amplified by the AC amplifier 15. More specifically, the spectrum analyzer 16 measures the amplitude and the phase of the detection signal for a reference frequency. The spectrum analyzer electrically couples the photodetector 13a. Here, the reference frequency is a frequency of a reference signal that operates the spectrum analyzer 16, and is a frequency of a synthesizer (a synthesizer built into the spectrum analyzer 16) that becomes a time base of the spectrum analyzer 16. That is, the spectrum analyzer 16 measures the phase of the detection signal for the frequency (reference frequency) of the built-in synthesizer. The reference frequency is set to a frequency (predetermined frequency) that is desired to be measured in the detection signal. Accordingly, the spectrum analyzer 16 can simultaneously measure the phase of the detection signal at the predetermined frequency and the amplitude of the detection signal at the predetermined frequency. Further, the spectrum analyzer 16 derives an IQ value at the predetermined frequency based on the phase and the amplitude of the detection signal at the predetermined frequency. I of the IQ value is "In-Phase" and indicates an in-phase component at the predetermined frequency. Further, "Q" is "Quadrature" and indicates a quadrature phase component at the predetermined frequency. An image obtained by mapping the in-phase component and the quadrature phase component of the detection signal to each irradiation position is an IQ image. Further, the spectrum analyzer 16 is electrically coupled to the tester unit 17 via a timing signal cable 24. The spectrum analyzer 16 measures a phase of a test signal output from the tester unit 17 for the reference frequency, similarly to the detection signal described above. The spectrum analyzer 16 can obtain a phase difference between the detection signal and the test signal by synchronizing the reference frequency that is a reference at the time of the phase measurement of the detection signal described above with a reference frequency that is a reference at the time of the phase measurement of the test signal. The spectrum analyzer 16 outputs the phase, the amplitude and the IQ value to the control unit 10 at the predetermined frequency. Further, the optical sensor unit 13 and the amplifier 14, the amplifier 14 and the AC amplifier 15, the AC amplifier 15 and the spectrum analyzer 16, and the spectrum analyzer 16 and the control unit 10 are electrically coupled to each other via a signal cable 20. Further, such a spectrum analyzer is realized by a Cross Domain Analyzer (registered trademark), or a device that is a combination of two spectrum analyzers. Further, a device that measures the phase or the like of the detection signal is not limited to the spectrum analyzer such as the spectrum analyzer 16, and various electrical measurement devices such as a lock-in amplifier or an oscilloscope may be used.

For example, the control unit 10 is a computer including at least a processor and a memory such as a PC. The control unit 10 controls each device of the image generation apparatus 1. The control unit 10 including a processor functions as the first image generation unit (a image processer) that generates a pattern image at a predetermined frequency based on the pattern signal input by the current detector 50. Further, the control unit 10 functions as a second image generation unit (the image processer) that generates an EOFM image based on at least one of the phase, the amplitude and the IQ value of the detection signal at the predetermined frequency input by the spectrum analyzer 16. The EOFM image is an image of signal strength of a portion operating at a specific frequency. The control unit 10 generates a phase image at the predetermined frequency based on the irradiation position (x position and y position) of the scan optical system 6 input by the laser scan controller 9 and the phase of the detection signal at the predetermined frequency input by the spectrum analyzer 16. Since the irradiation position is designated by the two-dimensional positional information as described above, it is possible to generate the phase image obtained by mapping the phase of the detection signal at the predetermined frequency to each irradiation position in a two-dimensional form. Similarly, the control unit 10 generates an amplitude image at the predetermined frequency through mapping to each irradiation position in the two-dimensional form based on the irradiation position (x position and y position) of the scan optical system 6 and the amplitude of the detection signal at the predetermined frequency. Similarly, the control unit 10 generates an IQ image at the predetermined frequency through mapping to each irradiation position in the two-dimensional form based on the irradiation position (x position and y position) of the scan optical system 6 and the IQ value of the detection signal at the predetermined frequency. The control unit 10 outputs the generated pattern image and the generated EOFM image to a display unit 18 electrically coupled via a display cable 25. The display unit 18 displays a superimposed image in which the EOFM image and the pattern image input by the control unit 10 are superimposed.

Next, an operation and effects of the image generation apparatus 1 according to this embodiment will be described.

When failure analysis is conventionally performed by acquiring the EOFM image, the EOFM image is displayed to be superimposed on the pattern image of the semiconductor device instead of only the EOFM image being simply displayed, to thereby specifically specify a failure position. Since it is necessary for a superimposed image obtained by superimposing the images to be acquired without the EOFM image and the pattern image being misaligned, both the EOFM image and the pattern image are simultaneously acquired and generated from detection signals of the same optical sensors in order to prevent drift of a stage. In this case, the detection signal is branched in a frequency band by a branch circuit and, for example, a DC component (low frequency component) of the detection signal is used for generation of the pattern image, and an AC component (high frequency component) is used for generation of the EOFM image.

However, when the branch circuit is used, a change in the detection signal from the optical sensor is attenuated by the branch circuit, and when a change in the measurement light is small, an S/N ratio of the EOFM image may be degraded. Further, since a low frequency component and a high frequency component are separated by the branch circuit, low frequency sensitivity of the EOFM image generated based on an AC component (high frequency component) may be degraded. Further, the AC component may not be completely branched from a DC component (low frequency component) used for generation of the pattern image, and the AC component that is not branched may become a noise of the pattern image. Further, the branch circuit is a part in which the high frequency component is easily lost.

In this regard, in the image generation apparatus 1 according to this embodiment, the pattern signal used for generation of the pattern image is acquired without using the branch circuit as described above. Specifically, in the image generation apparatus 1, the constant voltage V2 is applied from the optical sensor power supply 13b to the optical sensor 13a, and the current I2 is supplied to the optical sensor 13a. Thus, the current I2 supplied from the optical sensor power supply 13b to the optical sensor 13a depends on the intensity of the measurement light from the semiconductor device 2. Also, since the pattern signal is generated based on the current I2 and the pattern image is generated based on the pattern signal, the pattern image can depend on the intensity of the measurement light from the semiconductor device 2. Thus, since the pattern image that is an image depending on the measurement light from the semiconductor device 2 can be acquired without depending on the detection signal of the optical sensor 13a, for example, when the pattern image and the EOFM image are desired to be acquired as the images depending on the measurement light from the semiconductor device 2, the pattern image can be acquired from the above-described pattern signal and the EOFM image can be acquired from the detection signal of the optical sensor 13a. Thus, since the two images can be acquired without using the branch circuit, it is possible to improve the S/N ratio in comparison with a case in which the branch circuit is used. Further, there are no degradation of low frequency sensitivity of the EOFM image, generation of an AC component noise in the pattern image, and a loss of a high frequency component, which are problems when a frequency band is branched by the branch circuit to acquire the two images. Further, the configuration of the image generation apparatus is simplified by not using the branch circuit.

Further, the optical sensor power supply 13b includes the board power supply 13c that supplies the predetermined voltage V1, and the DC/DC converter 13d that transforms the predetermined voltage V1 supplied from the board power supply 13c into the constant voltage V2. By the optical sensor power supply 13b transforming the predetermined voltage V1 into the constant voltage V2, it is possible to reliably generate the pattern signal and the pattern image according to the magnitude of the current I2 supplied to the optical sensor 13a.

Further, the current detector 50 measures the current I2 supplied from the optical sensor power supply 13b to the optical sensor 13a and generates the pattern signal. Accordingly, it is possible to reliably measure the current supplied to the optical sensor 13a.

Further, since the DC/DC converter 13d is used as a transformation unit, it is possible to reliably perform transformation from the predetermined voltage V1 to the constant voltage V2.

Further, since the measurement target is the semiconductor device 2, it is possible to effectively achieve improvement of an S/N ratio of the image using the image generation apparatus 1 when the semiconductor device 2 is used.

Further, since the image generation apparatus 1 includes the spectrum analyzer 16 that measures at least one of the IQ value, the amplitude and the phase of the detection signal at the predetermined frequency or in the frequency band based on the detection signal output by the optical sensor 13a, the image generation apparatus 1 can reliably measure a parameter related to the generation of the EOFM image from the detection signal output by the optical sensor 13a.

Further, since the image generation apparatus 1 includes the control unit 10 that generates the EOFM image based on at least one of the IQ value, the amplitude, and the phase of the detection signal measured by the spectrum analyzer 16, the image generation apparatus 1 can reliably generate the EOFM image from the detection signal.

Further, since the image generation apparatus 1 includes the display unit 18 that displays the pattern image and the EOFM image in a superimposing manner, the image generation apparatus 1 can acquire the superimposed image in which the pattern image and the EOFM image are superimposed.

Second Embodiment

Next, an image generation apparatus according to a second embodiment will be described with reference to FIG. 4. Further, a difference between the second embodiment and the first embodiment described above will be mainly described in a description according to the second embodiment.

Figure 4:
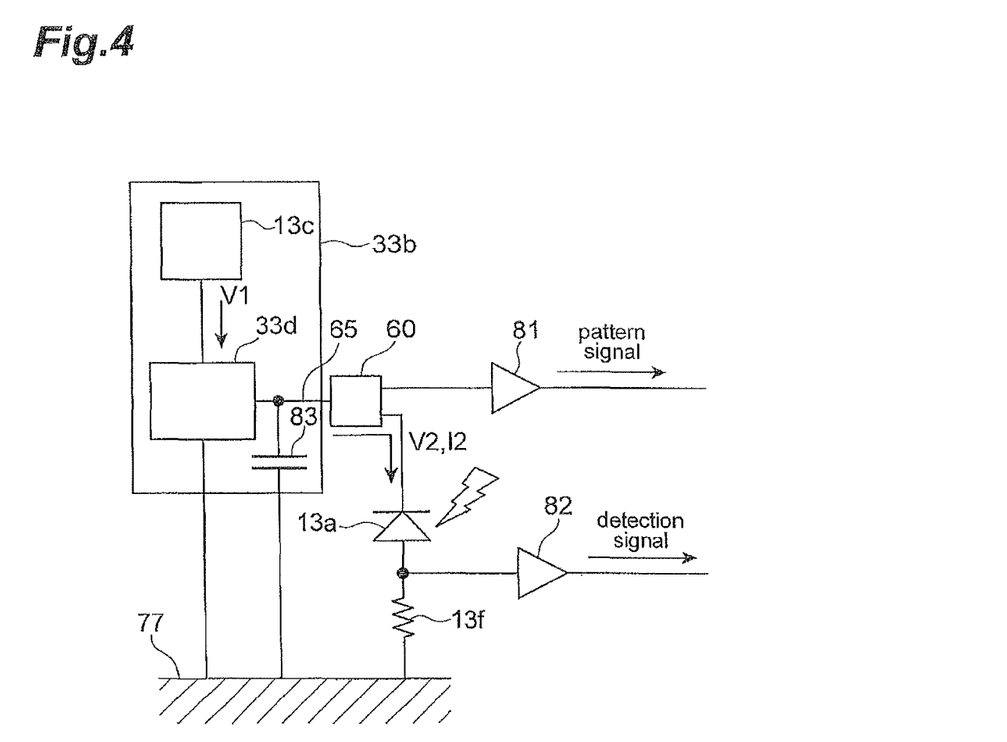
FIG. 4 is a diagram illustrating a current detector in an image generation apparatus of a second embodiment of the present invention.

FIG. 4 is a diagram illustrating a current detector (signal generation unit) 60 and an optical sensor power supply 33b in this embodiment. A difference between this embodiment and the first embodiment is that, in the first embodiment, the current detector 50 is arranged inside the DC/DC converter 13d whereas, in this embodiment, a current detector 60 is arranged outside a DC/DC converter 33d (outside an optical sensor power supply 33b) and a current I2 flowing through a wiring 65 that couples the DC/DC converter 33d to an optical sensor 13a is measured, as illustrated in FIG. 4. The current detector 60 converts magnitude of the measured current I2 into the pattern signal. With the current detector 60 arranged outside the DC/DC converter 33d in this way, the current supplied from the optical sensor power supply 33b to the optical sensor 13a can be reliably measured, similarly to the current detector 50 according to the first embodiment. Further, in the image generation apparatus according to this embodiment, a DC/DC converter (DC/DC converter 33d) which does not include a current detector therein can be used.

Third Embodiment

Next, an image generation apparatus according to a third embodiment will be described with reference to FIG. 5. Further, a difference between the third embodiment and the first and second embodiments described above will be mainly described in the invention according to the third embodiment.

Figure 5:
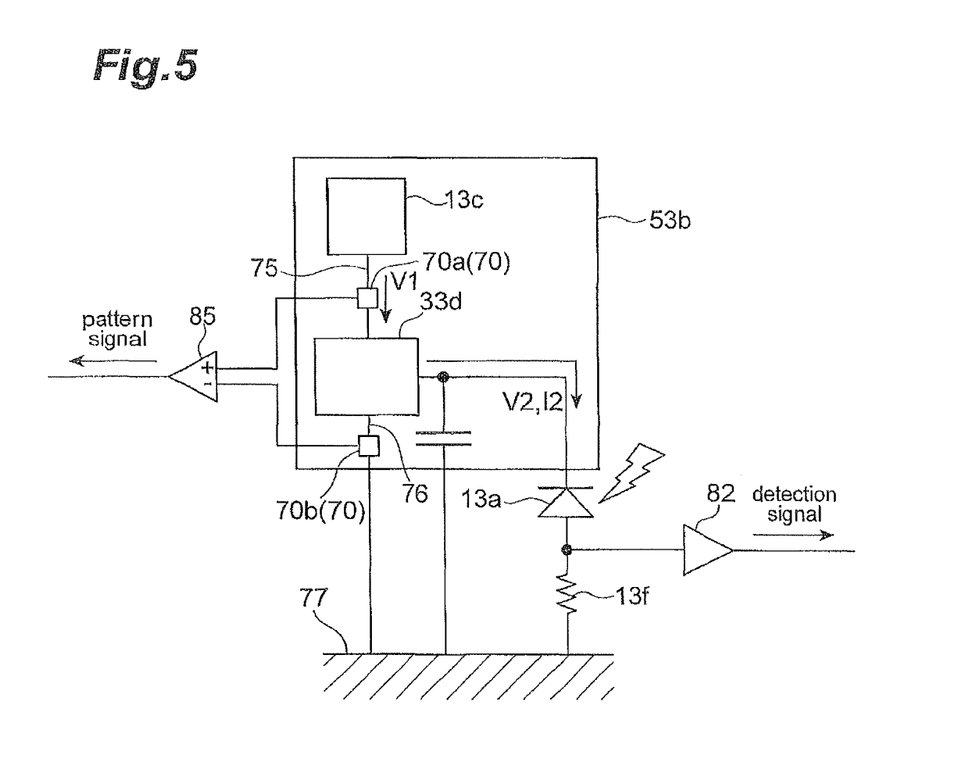
FIG. 5 is a diagram illustrating a current detector in an image generation apparatus of a third embodiment of the present invention.

FIG. 5 is a diagram illustrating a current detector (signal generation unit) 70 and an optical sensor power supply 53b in this embodiment. The image generation apparatus according to this embodiment includes current detectors 70a and 70b as the current detector 70, and a differential amplifier 85, as illustrated in FIG. 5. The current detector (a first current detector) 70a measures a current I3 flowing through a wiring 75 that couples the board power supply 13c to the DC/DC converter 33d. Further, the current detector (a second current detector) 70b measures a current I4 flowing through a wiring 76 that couples the DC/DC converter 33d to the ground potential line 77. The respective current detectors 70a and 70b are coupled to the differential amplifier 85. A current I2 is supplied from the DC/DC converter 33d to the optical sensor 13a, similarly to the first and second embodiments described above. Thus, the current I3 flows to the DC/DC converter 33d, and the current I4 and the current I2 flow from the DC/DC converter 33d. Therefore, since a pattern signal corresponding to the current I3 output from the current detector 70a and a pattern signal corresponding to the current I4 output from the current detector 70b are input to the differential amplifier 85, a pattern signal corresponding to the current I2 flowing from the DC/DC converter 33d to the optical sensor 13a, which is obtained by subtracting the current I4 from the current I3, is output. Further, a subtractor may be used in place of the differential amplifier 85.

Thus, since a difference between the current I3 flowing through the wiring 75 coupling the board power supply 13c to the DC/DC converter 33d and the current I4 flowing through the wiring 76 coupling the DC/DC converter 33d and the ground potential line 77 and the current I2 flowing from the DC/DC converter 33d to the optical sensor 13a have a predetermined corresponding relationship, it is possible to reliably measure the current I2 flowing from the DC/DC converter 33d to the optical sensor 13a based on the current difference. The current detector 70 converts magnitude of the measured current I2 into the pattern signal. Further, a DC/DC converter using a linear regulator is suitably used as the DC/DC converter 33d of this embodiment.

While the embodiments of the present invention have been described above, the present invention is not limited to the above-described embodiments. For example, the configuration that generates the light with which the semiconductor device is irradiated is not limited to the laser light source, and may be other light sources, such as an SLD (super luminescent diode), an ASE (amplified spontaneous emission), or an LED (light emitting diode) that generates incoherent light.

Figure 6:
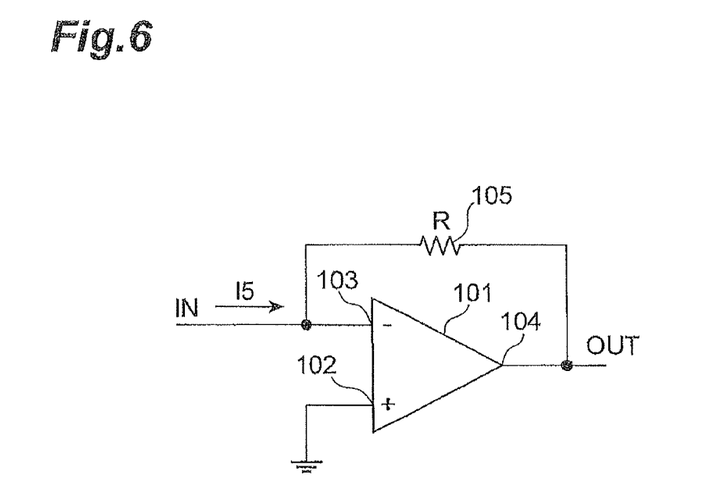
FIG. 6 is a diagram illustrating a configuration of a voltage conversion according to a modification example.

Further, while the detection signal output from the optical sensor unit has been described as being voltage-converted by a resistor, the configuration that voltage-converts the detection signal is not limited to the resistor and, for example, a transimpedance amplifier 100 as illustrated in FIG. 6 may be used in place of the resistor. In the transimpedance amplifier 100, a current I5 input to an inverting input terminal 103 of an operational amplifier 101 is voltage-converted by a resistor 105 and output as a detection signal from an output terminal 104 of the operational amplifier 101 in a state in which a non-inverting input terminal 102 of the operational amplifier 101 is grounded.

Further, while the semiconductor device has been illustrated as the measurement target, the present invention is not limited thereto.

What is claimed is:

1. An apparatus for generating an image based on light from a semiconductor device, the apparatus comprising:
   a photodetector configured to detect the light;
   a power supply unit electrically coupling the photodetector and configured to apply a first constant voltage to the photodetector to supply a current to the photodetector;

a signal generation unit electrically coupling the power supply unit and configured to measure the current supplied to the photodetector by the power supply unit and generate a first signal according to magnitude of the current; and an image processer configured to generate a first image indicating a circuit pattern of the semiconductor device based on the first signal according to magnitude of the current supplied to the photodetector by the power supply unit.

2. The apparatus according to claim 1, wherein the power supply unit comprises a power supply configured to supply a second voltage, and a transformer configured to transform the second voltage to the first constant voltage.

3. The apparatus according to claim 2, wherein the signal generation unit measures the current flowing from the transformer to the photodetector to generate the first signal.

4. The apparatus according to claim 2, wherein the signal generation unit comprises a first current detector configured to measure a current flowing through a wiring coupling the power supply to the transformer, and a second current detector configured to measure a current flowing through a wiring coupling the transformer to a ground potential line, and measures a current supplied from the power supply to the photodetector to generate the first signal based on a difference between the current measured by the first current detector and the current measured by the second current detector.

5. The apparatus according to claim 2, wherein the transformer comprises a DC/DC converter.

6. The apparatus according to claim 1, further comprising:

a measurement unit electrically coupling the photodetector and configured to measure at least one of a value indicating an in-phase component and a quadrature phase component, an amplitude, and a phase of a second signal output by the photodetector at a predetermined frequency or in a predetermined frequency band based on the second signal.

7. The apparatus according to claim 6, wherein the image processer generates a second image based on at least one of the value indicating an in-phase component and a quadrature phase component, the amplitude, and the phase of the second signal at the predetermined frequency or in the predetermined frequency band measured by the measurement unit.

8. The apparatus according to claim 7, further comprising:

a display configured to display a superimposed image that is superimposed the first image and the second image.

9. A method for generating an image based on light from a semiconductor device, the method comprising:

applying a first constant voltage to a photodetector configured to detect the light, to supply a current to the photodetector;

measuring the current supplied to the photodetector and generating a first signal according to magnitude of the current; and generating a first image indicating a circuit pattern of the semiconductor device based on the first signal according to magnitude of the current supplied to the photodetector by a power supply unit.

10. The method according to claim 9, wherein the applying of the first constant voltage to supply the current comprises by a power supply, supplying a second voltage different from the first constant voltage, and by a transformer, transforming the second voltage supplied from the power supply to the first constant voltage.

11. The method according to claim 10, wherein the generating of the first signal comprises measuring the current flowing from the transformer to the photodetector to generate the first signal.

12. The method according to claim 10, wherein the generating of the first signal comprises by a first current detector, measuring a current flowing through a wiring coupling the power supply to the transformer;

by a second current detector, measuring a current flowing through a wiring coupling the transformer to a ground potential line, and measuring a current supplied from the power supply to the photodetector to generate the first signal based on a difference between the current measured by the first current detector and the current measured by the second current detector.

* * * * *